April 15, 1969 D. FRIEDMAN 3,439,190

LOW-LEVEL SIGNAL SWITCHING ARRANGEMENTS

Filed Jan. 20, 1966

INVENTOR
D. FRIEDMAN
BY D. E. Swedeker
ATTORNEY

United States Patent Office 3,439,190

Patented Apr. 15, 1969

3,439,190

LOW-LEVEL SIGNAL SWITCHING ARRANGEMENTS

David Friedman, Howell Township, Monmouth County, N.J., assignor to Bell Telephone Laboratories, Incorporated, New York, N.Y., a corporation of New York Filed Jan. 20, 1966, Ser. No. 521,880

Int. Cl. H03k *17/74*

U.S. Cl. 307—259 8 Claims

ABSTRACT OF THE DISCLOSURE

The effects of switching transients on low level signals are minimized in a diode switching arrangement by connecting the signal path to a difference amplifier through coupling capacitors interconnected by an impedance that is low in value relative to the common mode input impedance of the amplifier. In operation the capacitors register difference potentials proportional to any differences in the electrical characteristics of the diode switching elements, causing switching transients to appear as common mode signals to the amplifier and to be rejected.

Figure 1:
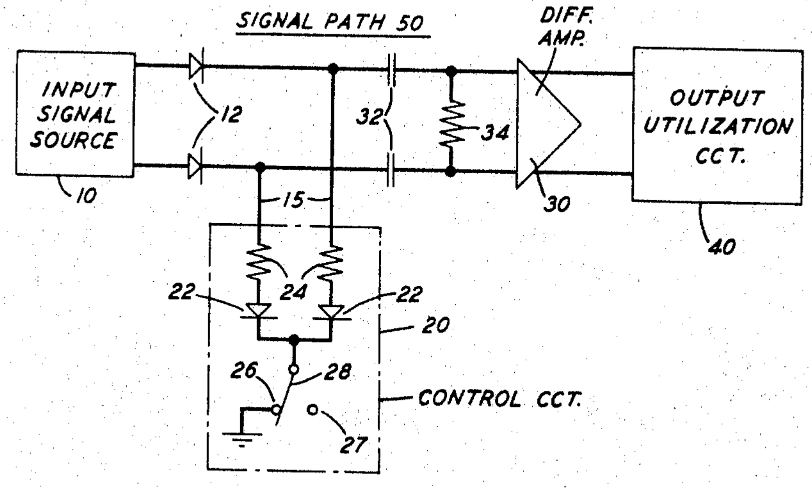

This invention relates to signal switching arrangements and more particularly to such arrangements for switching low level signals without introducing large switching transients.

Signal switching arrangements generally employ respective switching elements connected in circuit with the various circuit paths to be switched. The switching elements are often unilateral conducting devices such as diodes which may be biased selectively in a conducting or nonconducting state. Thus, the switching elements are normally biased in a nonconducting state, for example, and a particular signal path is switched by biasing the appropriate switching elements associated therewith in a conducting state. Conversely, in certain applications there is a requirement for blanking or muting transmission over a signal path during selected intervals, the switching element or elements associated with the path being normally biased conducting, and being selectively biased nonconducting for blanking or muting purposes.

Transient signals generated as a result of the switching elements being switched between their conducting and nonconducting states may be sufficient to interfere with signal transmission over the signal path or paths, particularly in the case of low level signals. The switching transients are often many times the magnitude of the signals being switched and thus are sufficient to mask or override the switched signals or to produce undesirable noise in the signal path.

The transient signals are due primarily to differences in the electrical characteristics of the various components in the signal paths, notably the impedances of the switching elements therein. In some instances the costly and time-consuming process of carefully selecting and matching the various circuit components has been adopted in an effort to reduce or eliminate the cause of the switching transients. In other instances, a fixed period of delay for amplifier or signal path recovery has been provided to allow the transient signals to subside, a solution that is undesirable or impracticable in many applications.

It is, therefore, a general object of this invention to provide a simple, compact and economical switching arrangement which substantially eliminates the effects of switching transients.

More particularly, it is an object of this invention to provide a simple and economical switching arrangement for switching low level signals into a high gain amplifier, which arrangement minimizes the effects of switching transients and minimizes amplifier recovery time.

A further object of the invention is to provide an improved blanking or muting circuit arrangement, the gating on and off of which does not produce significant transient signals in the signal path.

In accordance with a feature of my invention, the above and other objects are attained in an illustrative embodiment of a signal switching arrangement for switching a low level signal path into a high gain difference amplifier through a coupling capacitor and shunt resistor circuit configuration which minimizes the effects of switching transient signals and which minimizes signal path recovery time. Switching elements, such as diodes, selectively connect the signal path to the difference amplifier through the coupling capacitors, which are interconnected by a shunt resistor having a low impedance relative to the common mode input impedance of the amplifier. In operation, the coupling capacitors register difference potentials proportional to differences in the impedances of the switching elements. Thus, any unwanted signals appearing in the signal path when the path is not selected, such as due to switching or selection transients, are directed through the coupling capacitors and the shunt resistor as common mode signals to the difference amplifier and tend to be rejected. I have found such an arrangement to be particularly useful in blanking or muting circuits, for example to prevent large overhead signals from disturbing a high gain amplifier without causing disturbances due to the blanking or muting action, thereby permitting faster signal path recovery.

A further feature of my invention relates to the advantageous application of my invention in various arrangements for selectively connecting individual ones of a plurality of inputs to a common output amplifier, while minimizing the effects of selection transients. In accordance with an embodiment of my invention, in such a selection arrangement impedances are connected in circuit with the coupling capacitors in each input path to isolate common mode signals in nonselected paths from affecting the switching elements in a selected input path. All nonselected input signals appear common mode to the amplifier and tend to be rejected, only the selected input signal appearing differentially to the amplifier, so long as each input is selected at least often enough to retain the difference potentials on the coupling capacitors.

Figure 2:
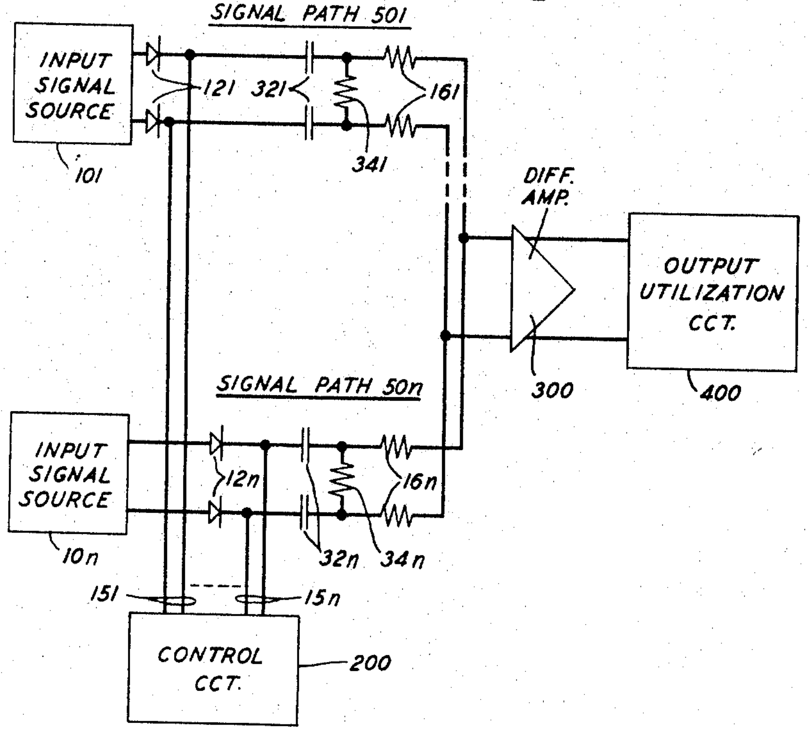

The above and other objects and features of the present invention may be fully apprehended from the following detailed description when considered with reference to the accompanying drawing in which:

FIG. 1 shows an illustrative embodiment of a signal blanking circuit in accordance with the principles of my invention; and FIG. 2 shows an illustrative embodiment of a selection circuit in accordance with the principles of my invention.

In FIG. 1 of the drawing, an illustrative embodiment of a signal switching arrangement is shown for selectively blanking the input of difference amplifier 30 connected in signal path 50 between input signal source 10 and output utilization circuit 40. Switching elements, illustratively depicted as switching element diodes 12 are connected in circuit with signal path 50 and are biased selectively in a conducting or nonconducting state by control circuit 20. Thus, diodes 12 are normally biased in a conducting state by control circuit 20 to permit the transmission of signals over signal path 50 from input source 10 to amplifier 30; and for signal blanking purposes diodes 12 are biased in a nonconducting state by control circuit 20.

Control circuit 20 is shown in FIG. 1, by way of example, as comprising switch 28, a pair of resistors 24, and diodes 22 connected over control leads 15 to switching element diodes 12. When switch 28 is in the position shown in FIG. 1, contacting terminal 26 connected to ground potential, diodes 12 are forward biased in a conducting state to permit the transmission of signals therethrough over signal path 50 to amplifier 30. When switch 28 is operated to terminal 27, ground potential is removed from control leads 15, placing diodes 12 in a nonconducting state to blank the input to amplifier 30 over signal path 50.

As diodes 12 are switched between their conducting and nonconducting state in the manner just described, transient signals may be generated of sufficient magnitude to interfere adversely with signal transmission over signal path 50, such as through temporary overloading of amplifier 30. These transient signals, often as large as one hundred times the magnitude of low level signals being transmitted over signal path 50, arise primarily from differences in the electrical characteristics, particularly the impedances, of the several switching element diodes 12 connected in signal path 50. Accordingly, heretofore it has been generally necessary to carefully match the electrical characteristics of the several diodes to eliminate the cause of the switching transients, or to provide a predetermined period of delay after switching to ensure signal path recovery from the signal transients.

In accordance with my invention, however, the effects of switching transients are substantially eliminated and signal path recovery time is minimized through the use of coupling capacitors 32 connected in circuit with respective diodes 12 in signal path 50 and interconnected by shunt resistor 34. The capacity of capacitors 32 is determined principally by the frequency response of amplifier 30. Shunt resistor 34 is of an impedance low in value relative to the common mode input impedance of amplifier 30. In operation, coupling capacitors 32 register difference potentials proportional to differences in the impedances of diodes 12.

Assume, for the purposes of describing the operation of the blanking circuit embodiment of FIG. 1, that diodes 12 are biased in a conducting state by control circuit 20, switch 28 thereof being operated initially to the position shown in FIG. 1 enabling signals from source 10 to be transmitted over signal path 50 to amplifier 30 and output utilization circuit 40. With the initial operation of switch 28 to ground potential at terminal 26, as shown in FIG. 1, capacitors 32 register difference potentials proportional to differences in the impedances of respective diodes 12. Upon registration of the difference potentials on capacitors 32, transients generated by subsequent operation of switch 28 between terminals 26 and 27 are directed to amplifier 30 as common mode signals, which tend to be rejected. The only signals appearing differentially across resistor 34 at the input of difference amplifier 30 and the signals from input signal source 10.

When switch 28 is operated to terminal 27 to blank signal path 50, there no longer exists any path for presenting signals from source 10 differentially to difference amplifier 30, and thus to output utilization circuit 40. Diodes 22 in control circuit 20 prevent the flow of current through resistors 24 differentially to amplifier 30. With switch 28 operated to terminal 27, all sginals in signal path 50 are presented as common mode signals to difference amplifier 30 and thus are not directed therethrough to output utilization circuit 40. For example, assume that a signal, due to switching operation or otherwise, appears at the output of one of diodes 12, such as diode 12 in circuit with the upper conductor of signal path 50 in FIG. 1. This signal is directed through the associated capacitor 32 to difference amplifier 30. Inasmuch as resistor 34 is a low impedance compared to the common mode input impedance of amplifier 30, the signal is applied substantially equally to both inputs of amplifier 30 and is substantially rejected thereby.

The advantages of my invention in minimizing the effects of switching transients, therefore, may be readily appreciated. If, for example, amplifier 30 has a gain of 300 and diodes 12 differ in impedance so as to produce a 100 millivolt difference in forward voltage drops, the normal switching transient signal presented to output utilization circuit 40 in the absence of my arrangement would be 30 volts. Such a switching transient signal would severely overload amplifier 30 and could cause recovery problems. On the other hand, with the connection of my arrangement of capacitors 32 and shunt resistor 34 in signal path 50, illustratively having values of 5 microfarads and 10,000 ohms, respectively, in a particular embodiment in accordance with my invention, the switching transient signal appearing at output utilization circuit 40 was reduced substantially to a magnitude on the order of one volt. Accordingly, an improvement on the order of 30-to-1 was produced in the particular illustrative embodiment of my invention over the usual diode blanking circuit.

The principles of my invention described above may be extended advantageously to a selection circuit such as shown illustratively in FIG. 2, wherein one of a plurality of input sources is selectively connected to an output utilization circuit. In FIG. 2, individual ones of input signal sources 101 through 10*n* are selectively connectable over corresponding signal paths 501 through 50*n* to common output amplifier 300 and therethrough to output utilization circuit 400. Input signal source selection is effected by control circuit 200 connected via respective selection leads 151 through 15*n* to each of the plurality of signal paths 501 through 50*n*.

Respective selection diodes 121 through 12*n* are connected in circuit with each input signal source. For input source selection purposes, these diodes are selectively biased in a conducting or nonconducting state by appropriate selection signals over the respective selection leads from control circuit 200. Therefore, to select a particular one of the input signal sources such as input signal source 101, control circuit 200 applies a signal over selection lead 151 to bias diodes 121 in a conducting state, thereby providing a conducting path over signal path 501 to amplifier 300. At the same time, control circuit 200 applies a signal over each of the other selection leads such as selection leads 15*n* to bias selection diodes 12*n* and all other selection diodes associated with nonselected input signal sources in a nonconducting state.

As a result of input signal source selection in the manner just described, transient signals may be generated, due to difference in the impedances of the various selection diodes, of a magnitude sufficient to interfere adversely with the operation of amplifier 300 or with output utilization circuit 400. To minimize the effects of such transients, respective coupling capacitors 321 through 32*n*, and respective shunt resistors 341 through 34*n*, are connected in circuit with each of signal paths 501 through 50*n*. In the manner described above in connection with FIG. 1, the respective coupling capacitors in each signal path register potential differences proportional to differences in the impedances of the respective selection diodes in the individual signal paths. Accordingly, transients generated by operation of the selection circuit are directed by virtue of respective shunt resistors 341 through 34*n* as common mode signals to amplifier 300. Only input signals from a selected signal path in which the selection diodes are biased in a conducting state are presented differentially to amplifier 300 for amplification. Respective impedances 161 through 16*n* in each signal path isolate common mode signals in nonselected paths from affecting the operation of the selection diodes in a selected signal path.

Th potentials registered on coupling capacitors 321 through 32*n* tend to be leaked off slowly through the high common mode input impedance of amplifier 300. Therefore, the selection circuit shown in FIG. 2 is most effective in minimizing the effects of switching transients when employed in applications wherein each of signal paths 501 through 50*n* is selected at least often enough to retain the difference potentials registered on capacitors 321 through 32*n*.

It is to be understood that the above-described arrangements are merely illustrative of the principles of the present invention. Numerous other arrangements may be devised by those skilled in the art without departing from the spirit and scope of the invention.

I claim:

1. In combination, a source of signals; output means; and signal path means for selectively connecting said source to said output means comprising, a signal path including a pair of conductors, switching means including a pair of switching elements individually connected in circuit with respective ones of said conductors and operative for connecting said source to said output means over said signal path, means for operating said switching means, differences between the respective impedances of said switching elements causing switching transients upon operation of said switching means, and capacitive storage means including a pair of capacitors individually connected in circuit with respective ones of said switching elements, and an impedance interconnecting said capacitors, said capacitive storage means registering difference potentials proportional to said switching elements impedance differences.

2. In combination, a source of signals; output means; and signal path means for selectively connecting said source to said output means comprising, a signal path, switching means in circuit with said signal path and operative for connecting said source to said output means over said signal path, means for operating said switching means, capacitive storage means in circuit with said signal path for substantially eliminating the effects on said output means for switching transients caused by operation of said switching means, and a difference amplifier connected in circuit with said signal path, the input of said difference amplifier being connected to said capacitive storage means and the output of said difference amplifier being connected to said output means, whereby said capacitive storage means causes said switching transients to appear as common mode signals to said difference amplifier.

3. The combination in accordance with claim 2 wherein said signal path comprises a pair of conductors, wherein said switching means comprises a pair of switching elements individually connected in circuit with respective ones of said conductors, differences between the respective impedances of said switching elements causing switching transients upon operation of said switching means, and wherein said capacitive storage means registers difference potentials proportional to said switching element impedance differences.

4. The combination in accordance with claim 3 wherein said capacitive storage means comprises a pair of capacitors individually connected in circuit with respective ones of said switching elements and resistance means interconnecting said capacitors.

5. The combination in accordance with claim 4 wherein said resistance means has a low impedance value relative to the common mode input impedance of said difference amplifier.

6. The combination in accordance with claim 2 wherein said signal path means further comprises a pair of conductors, said difference amplifier being connected in circuit with said conductors, wherein said switching means comprises a pair of switching elements individually connected in circuit with respective ones of said conductors, differences between the respective impedances of said switching elements causing switching transients upon operation of said switching means, and wherein said capacitive storage means includes a pair of capacitors individually connected in circuit with respective ones of said switching elements and a shunt resistor interconnecting said capacitors for registering difference potentials on said capacitors proportional to said switching element impedance differences.

7. In combination, a first source of signals, a second source of signals, output means, a first signal path including a pair of conductors, a second signal path including a pair of conductors, first switching means including a pair of switching elements individually connected in circuit with respective one of said conductors of said first signal path and operative for connecting said first source to said output means over said first signal path, second switching means including a pair of switching elements individually connected in circuit with respective ones of said conductors of said second signal path and operative for connecting said second source to said output means over said second signal path, first capacitor storage means in circuit with said first signal path for registering difference potentials proportional to impedance differences between said switching elements of said first switching means, second capacitor storage means in circuit with said second signal path for registering difference potentials proportional to impedance differences between said switching elements of said second switching means, and means for selectively operating said first and said second switching means.

8. The combination in accordance with claim 7 further comprising individual impedance means in circuit with said first-mentioned signal path and said second signal path for preventing signals from one of said signal paths affecting the operation of said switching means in the other of said signal paths.

References Cited

UNITED STATES PATENTS

| | | | |
|---|---|---|---|
| 3,127,564 | 3/1964 | Giger | 328—165 X |
| 3,289,089 | 11/1966 | Linder | 328—165 X |

FOREIGN PATENTS

| | | |
|---|---|---|
| 1,104,999 | 4/1961 | Germany. |

ARTHUR GAUSS, *Primary Examiner.*

B. P. DAVIS, *Assistant Examiner.*

U.S. Cl. X.R.

307—317, 256